(12) United States Patent
Weidner et al.

(10) Patent No.: US 12,002,901 B2
(45) Date of Patent: Jun. 4, 2024

(54) OPTOELECTRONIC SEMICONDUCTOR COMPONENT

(71) Applicant: OSRAM Opto Semiconductors GmbH, Regensburg (DE)

(72) Inventors: Karl Weidner, Munich (DE); Ralph Wirth, Lappersdorf (DE); Axel Kaltenbacher, Ingolstadt (DE); Walter Wegleiter, Nittendorf (DE); Bernd Barchmann, Regensburg (DE); Oliver Wutz, Regensburg (DE); Jan Marfeld, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 18/212,935

(22) Filed: Jun. 22, 2023

(65) Prior Publication Data

US 2023/0352617 A1   Nov. 2, 2023

Related U.S. Application Data

(60) Continuation of application No. 17/552,657, filed on Dec. 16, 2021, now Pat. No. 11,749,776, which is a
(Continued)

(30) Foreign Application Priority Data

Aug. 7, 2009   (DE) ..................... 10 2009 036 621.0

(51) Int. Cl.
*H01L 33/00*    (2010.01)
*H01L 23/31*    (2006.01)
(Continued)

(52) U.S. Cl.
CPC ...... *H01L 33/0093* (2020.05); *H01L 23/3107* (2013.01); *H01L 23/3185* (2013.01);
(Continued)

(58) Field of Classification Search
CPC ......... H01L 31/02322; H01L 31/02005; H01L 25/0753; H01L 33/486; H01L 31/0203;
(Continued)

(56) References Cited

U.S. PATENT DOCUMENTS 6,749,476 B2   6/2004   Chang
6,777,070 B1   8/2004   Murata et al.
(Continued)

FOREIGN PATENT DOCUMENTS

CN   101238592 A   8/2008
CN   101366127 A   2/2009
(Continued)

OTHER PUBLICATIONS

European Examination Report dated Jul. 22, 2013 of counterpart European Application No. 10 742 446.7.
(Continued)

*Primary Examiner* — Mouloucoulaye Inoussa
(74) *Attorney, Agent, or Firm* — DLA Piper LLP (US)

(57) ABSTRACT

An optoelectronic semiconductor component includes an optoelectronic semiconductor chip having a top area at a top side, a bottom area at an underside, at least one side area connecting the top area and the bottom area; electrical contact locations at the top area or at the bottom area of the optoelectronic semiconductor chip; and a molded body, wherein the molded body surrounds the optoelectronic semiconductor chip at all side areas at least in places, the molded body is electrically insulating, and the molded body is free of any conductive element that completely penetrates the molded body.

16 Claims, 6 Drawing Sheets

Related U.S. Application Data division of application No. 16/851,232, filed on Apr. 17, 2020, now Pat. No. 11,239,386, which is a division of application No. 15/963,408, filed on Apr. 26, 2018, now Pat. No. 10,665,747, which is a continuation of application No. 15/632,544, filed on Jun. 26, 2017, now Pat. No. 9,985,171, which is a continuation of application No. 15/288,176, filed on Oct. 7, 2016, now Pat. No. 9,728,683, which is a continuation of application No. 14/931,246, filed on Nov. 3, 2015, now Pat. No. 9,490,396, which is a division of application No. 14/223,173, filed on Mar. 24, 2014, now Pat. No. 9,209,328, which is a division of application No. 13/320,304, filed as application No. PCT/EP2010/060434 on Jul. 19, 2010, now Pat. No. 8,723,192.

(51) Int. Cl.

| | |
|---|---|
| *H01L 25/04* | (2023.01) |
| *H01L 25/075* | (2006.01) |
| *H01L 31/02* | (2006.01) |
| *H01L 31/0203* | (2014.01) |
| *H01L 31/0232* | (2014.01) |
| *H01L 31/18* | (2006.01) |
| *H01L 33/48* | (2010.01) |
| *H01L 33/50* | (2010.01) |
| *H01L 33/54* | (2010.01) |
| *H01L 33/56* | (2010.01) |
| *H01L 33/60* | (2010.01) |
| *H01L 33/62* | (2010.01) |

(52) U.S. Cl.
CPC ........ *H01L 25/042* (2013.01); *H01L 25/0753* (2013.01); *H01L 31/02005* (2013.01); *H01L 31/0203* (2013.01); *H01L 31/0232* (2013.01); *H01L 31/02322* (2013.01); *H01L 31/02327* (2013.01); *H01L 31/1892* (2013.01); *H01L 33/483* (2013.01); *H01L 33/486* (2013.01); *H01L 33/502* (2013.01); *H01L 33/56* (2013.01); *H01L 33/60* (2013.01); *H01L 33/62* (2013.01); *H01L 33/54* (2013.01); *H01L 2924/0002* (2013.01); *H01L 2933/0033* (2013.01); *H01L 2933/005* (2013.01); *H01L 2933/0066* (2013.01)

(58) Field of Classification Search
CPC ... H01L 25/042; H01L 33/483; H01L 33/502; H01L 31/02327; H01L 33/62; H01L 31/1892; H01L 33/56; H01L 23/3185; H01L 33/0093; H01L 33/60; H01L 23/3107; H01L 31/0232; H01L 33/54; H01L 33/22; H01L 33/385; H01L 33/52; H01L 33/0095; H01L 25/13; H01L 33/50; H01L 25/167; H01L 33/382; H01L 33/44; H01L 33/36; H01L 24/45; H01L 33/505; H01L 33/405; H01L 33/10; H01L 33/46
USPC ... 257/88, 98, 13, 94, 79, 774, 96, E33.067, 257/E33.061, E33.066, E33.056; 438/27, 438/34, 28, 29; 315/308
See application file for complete search history.

(56) References Cited

U.S. PATENT DOCUMENTS

| | | | |
|---|---|---|---|
| 7,843,534 B2 | 11/2010 | Chang et al. | |
| 8,097,894 B2 * | 1/2012 | Bierhuizen | H01L 33/46 |
| | | | 257/100 |
| 2004/0090161 A1 | 5/2004 | Noguchi et al. | |
| 2004/0208210 A1 | 10/2004 | Inoguchi | |
| 2004/0245530 A1 | 12/2004 | Kameyama et al. | |
| 2004/0245641 A1 | 12/2004 | Eguchi | |
| 2005/0151147 A1 | 7/2005 | Izuno et al. | |
| 2006/0097245 A1 | 5/2006 | Aanegola et al. | |
| 2006/0138621 A1 | 6/2006 | Bogner et al. | |
| 2007/0102693 A1 | 5/2007 | Nagai | |
| 2007/0126016 A1 | 6/2007 | Chen et al. | |
| 2007/0164302 A1 | 7/2007 | Tanda | |
| 2008/0036364 A1 | 2/2008 | Li et al. | |
| 2008/0083929 A1 | 4/2008 | Fan et al. | |
| 2008/0111233 A1 * | 5/2008 | Pendse | H01L 24/13 |
| | | | 257/E23.101 |
| 2008/0173884 A1 | 7/2008 | Chitnis et al. | |
| 2008/0179611 A1 | 7/2008 | Chitnis et al. | |
| 2008/0180606 A1 | 7/2008 | Chang et al. | |
| 2008/0203410 A1 | 8/2008 | Brunner et al. | |
| 2008/0277799 A1 | 11/2008 | Benson et al. | |
| 2008/0290351 A1 | 11/2008 | Ajiki et al. | |
| 2008/0298601 A1 | 12/2008 | Rahbar | |
| 2009/0039359 A1 | 2/2009 | Yoon et al. | |
| 2009/0057699 A1 | 3/2009 | Basin et al. | |
| 2009/0065800 A1 | 3/2009 | Wirth et al. | |
| 2009/0102002 A1 * | 4/2009 | Chia | H01L 27/14618 |
| | | | 257/E31.113 |
| 2009/0173957 A1 | 7/2009 | Brunner et al. | |
| 2009/0213469 A1 | 8/2009 | Braune et al. | |
| 2009/0309113 A1 | 12/2009 | Eichler et al. | |
| 2010/0012955 A1 | 1/2010 | Sorg et al. | |
| 2010/0078656 A1 | 4/2010 | Seo et al. | |
| 2010/0276706 A1 | 11/2010 | Herrmann | |
| 2010/0320479 A1 | 12/2010 | Minato et al. | |
| 2011/0049545 A1 | 3/2011 | Basin et al. | |

FOREIGN PATENT DOCUMENTS

| | | |
|---|---|---|
| DE | 102 45 930 A1 | 4/2004 |
| DE | 10 2004 047 061 A1 | 4/2006 |
| DE | 10 2007 030 129 A1 | 1/2009 |
| DE | 10 2011 080 458 A1 | 2/2013 |
| JP | 11-214754 A | 8/1999 |
| JP | 11-220180 A | 8/1999 |
| JP | 2000-124507 A | 4/2000 |
| JP | 2002-335020 A | 11/2002 |
| JP | 2003-7929 A | 1/2003 |
| JP | 2003-168762 A | 6/2003 |
| JP | 2003-309293 A | 10/2003 |
| JP | 2004-71895 A | 3/2004 |
| JP | 2004-119743 A | 4/2004 |
| JP | 2004-363380 A | 12/2004 |
| JP | 2005-183777 A | 7/2005 |
| JP | 2008-47832 A | 2/2008 |
| JP | 2008-109156 A | 5/2008 |
| JP | 2008-294224 A | 12/2008 |
| KR | 10-2007-0047057 A | 5/2007 |
| TW | 486709 B | 5/2002 |
| TW | 503337 B | 9/2002 |
| TW | 514757 B | 12/2002 |
| TW | 527492 B | 4/2003 |
| TW | 200501209 A | 1/2005 |
| TW | I308307 B | 4/2009 |
| TW | I354381 B | 12/2011 |
| TW | I392322 B | 4/2013 |
| WO | 02/084749 A2 | 10/2002 |
| WO | 2008/115213 A2 | 9/2008 |
| WO | 2009/003442 A1 | 1/2009 |
| WO | 2009/069671 A1 | 6/2009 |
| WO | 2009/075530 A2 | 6/2009 |
| WO | 2009/075753 A2 | 6/2009 |

OTHER PUBLICATIONS

English translation of Taiwanese Examination Report dated Nov. 22, 2013 of counterpart Taiwanese Patent Application No. 099124509.
English translation of Notification of Reasons for Rejection dated Dec. 2, 2014 of counterpart Japanese Patent Application No. 2012-523272.

(56) References Cited

OTHER PUBLICATIONS

English translation of Notice of Reasons for Rejection dated May 26, 2016 of counterpart Japanese Patent Application No. 2015-168164.
Chinese Office Action dated Oct. 9, 2017 of counterpart Chinese Application No. 201610097076.X with English translation.
English translation of Notice of Final Rejection dated May 24, 2018 of counterpart Korean Application No. 10-2017-7020407.
Notice of Allowance dated Jul. 3, 2018 of counterpart South Korean Application No. 10-2017-7020407 with English translation.
Notice to File a Response dated Aug. 3, 2018 of counterpart South Korean Application No. 10-2018-7017728 with English translation.
Notice of Final Rejection dated Feb. 8, 2019 of counterpart South Korean Application No. 10-2018-7017728 with English translation.
Notice of Final Rejection dated Apr. 9, 2019 of counterpart South Korean Application No. 10-2018-7017728 with English translation.
Notice of Trial Decision dated May 28, 2019 of counterpart South Korean Application No. 10-2012-7006122 with brief English summary.
Notice of Trial Decision dated Feb. 24, 2020 of counterpart South Korean Application No. 10-2018-7017728 with English translation.
German Examination Report dated Jan. 25, 2021 of counterpart German Application No. 102009036621.0 with machine English translation.
German Examination Report dated Sep. 24, 2020 of counterpart German Application No. 102009036621.0 with machine English translation.
Examination and Search Report dated Nov. 23, 2023, of counterpart German Patent Application No. 10 2009 061 887.2, along with an English machine translation.
Summons for the Hearing dated Jun. 29, 2023, of counterpart German Patent Application No. 10 2009 036 621.0, along with an English translation.
Notice to File a Response dated Aug. 3, 2018 of counterpart South Korean Application No. 10-2018-017728 with English translation.
Notice of Trial Decision dated Feb. 24, 2020 of counterpart South Korean Application No. 10-2018-7017729 with English translation.

\* cited by examiner

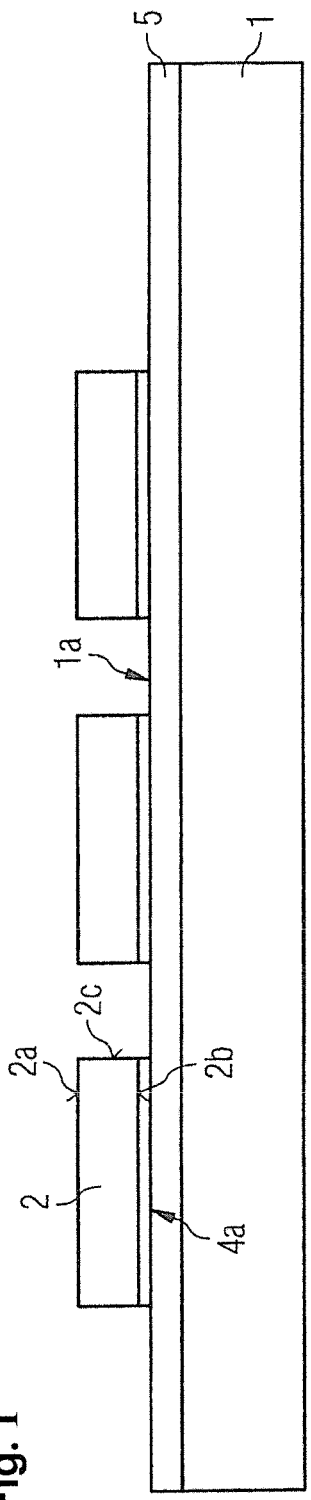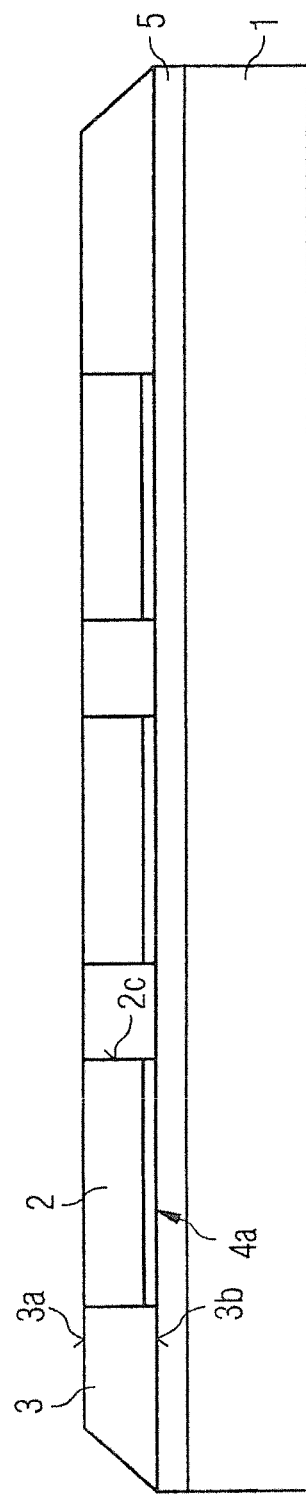

OPTOELECTRONIC SEMICONDUCTOR COMPONENT

RELATED APPLICATIONS

This application is a continuation of U.S. Ser. No. 17/552,657, filed Dec. 16, 2021, which is a divisional of U.S. Ser. No. 16/851,232, filed Apr. 17, 2020 (U.S. Pat. No. 11,239,386, issued Feb. 1, 2022, which is a divisional of U.S. Ser. No. 15/963,408, filed Apr. 26, 2018 (U.S. Pat. No. 10,665,747, issued May 26, 2020), which is a continuation of U.S. Ser. No. 15/632,544, filed Jun. 26, 2017 (U.S. Pat. No. 9,985,171, issued May 29, 2018), which is a continuation of U.S. Ser. No. 15/288,176, filed Oct. 7, 2016 (U.S. Pat. No. 9,728,683, issued Aug. 8, 2017), which is a continuation of U.S. Ser. No. 14/931,246, filed Nov. 3, 2015 (U.S. Pat. No. 9,490,396, issued Nov. 8, 2016), which is a divisional of U.S. Ser. No. 14/223,173, filed Mar. 24, 2014 (U.S. Pat. No. 9,209,328, issued Dec. 8, 2015), which is a divisional of U.S. Ser. No. 13/320,304, filed Jan. 23, 2012 (U.S. Pat. No. 8,723,192, issued May 13, 2014), which is a § 371 of International Application No. PCT/EP2010/060434, with an international filing date of Jul. 19, 2010, which is based on German Patent Application No. 10 2009 036 621.0, filed Aug. 7, 2009.

TECHNICAL FIELD

This disclosure relates to methods of producing optoelectronic semiconductor components and optoelectronic semiconductor components made by the methods.

BACKGROUND

WO 2009/075753 A2 and WO 02/084749 each describe an optoelectronic semiconductor component. However, it could be helpful to provide a simplified production method of producing optoelectronic semiconductor components and components produced thereby.

SUMMARY

We provide an optoelectronic semiconductor component including an optoelectronic semiconductor chip having a top area at a top side, a bottom area at an underside, at least one side area connecting the top area and the bottom area; electrical contact locations at the top rea or at the bottom area of the optoelectronic semiconductor chip; and a molded body, wherein the molded body surrounds the optoelectronic semiconductor chip at all side areas at least in places, the molded body is electrically insulating, and the molded body is free of any conductive element that completely penetrates the molded body.

We further provide a method of producing an optoelectronic semiconductor component including providing a carrier; arranging at least one optoelectronic semiconductor chip at a top side of the carrier, wherein the semiconductor chip includes semiconductor layers deposited on a substrate; and forming a molded body around the at least one optoelectronic semiconductor chip, wherein the molded body surrounds all side areas of the at least one optoelectronic semiconductor chip at least in places such that at least some of the layers deposited on the substrate are free of the molded body such that these layers are not covered or completely exposed, removing the carrier.

We also provide a method of producing an optoelectronic semiconductor component including providing a carrier, arranging at least one optoelectronic semiconductor chip at a top side of the carrier, shaping a shaped body around the at least one optoelectronic semiconductor chip, wherein the shaped body covers all side areas of the at least one optoelectronic semiconductor chip, and wherein a surface facing away from the carrier at the top side and/or a surface facing the carrier at an underside of the at least one semiconductor chip remains substantially free of the shaped body or is exposed, and removing the carrier.

We also provide an optoelectronic semiconductor component including an optoelectronic semiconductor chip having side areas covered by a shaped body, at least one plated-through hole including an electrically conductive material, and an electrically conductive connection electrically conductively connected to the semiconductor chip and the plated-through hole, wherein the plated-through hole is laterally spaced apart from the semiconductor chip, the plated-through hole completely penetrates through the shaped body, the plated-through hole extends from a top side of the shaped body to an underside of the shaped body, and the electrically conductive connection extends at the top side of the shaped body.

We further provide an optoelectronic semiconductor component including an optoelectronic semiconductor chip having side areas covered by a shaped body, and an electrically conductive connection electrically conductively connected to the semiconductor chip and the plated-through hole, wherein the plated-through hole is laterally spaced apart from the semiconductor chip, the plated-through hole completely penetrates through the shaped body, the plated-through hole extends from a top side of the shaped body to an underside of the shaped body, and the shaped body is optically reflective.

We further yet provide an optoelectronic semiconductor component including an optoelectronic semiconductor chip having side areas, a surface at a top side of the semiconductor chip, and a surface at a bottom side of the semiconductor chip; a shaped body having a surface at a top side of the shaped body and a surface at an underside of the shaped body; at least one plated-through hole including an electrically conductive material; and an electrically conductive connection electrically conductively connected to the semiconductor chip and the plated-through hole, wherein the side areas of the optoelectronic semiconductor chip are covered by the shaped body, and the surface at the top side and/or the surface at the bottom side of the optoelectronic semiconductor chip are completely free of the shaped body.

We also further provide an optoelectronic semiconductor component including an optoelectronic semiconductor chip having side areas, a surface at a top side of the semiconductor chip, and a surface at a bottom side of the semiconductor chip; a shaped body having a surface at a top side of the shaped body and a surface at an underside of the shaped body; at least one plated-through hole including an electrically conductive material; and an electrically conductive connection electrically conductively connected to the semiconductor chip and the plated-through hole, wherein the side areas of the optoelectronic semiconductor chip are covered by the shaped body, and the shaped body covers the side areas of the semiconductor chip up to a selected height such that the side areas of the semiconductor chip are free of the shaped body in places or the surface at the top side and the surface at the underside of the shaped body terminates flush with the surface at the top side and the surface at the bottom side of the semiconductor chip, respectively.

We also further provide an optoelectronic semiconductor component including an optoelectronic semiconductor chip having side areas, a surface at a top side of the semiconductor chip, and a surface at a bottom side of the semiconductor chip; and a shaped body having a surface at a top side of the shaped body and a surface at an underside of the shaped body, wherein the side areas of the optoelectronic semiconductor chip are covered by the shaped body, and the surface at the top side and/or the surface at the bottom side of the optoelectronic semiconductor chip are free of the shaped body.

We also further provide an optoelectronic semiconductor component including an optoelectronic semiconductor chip having side areas covered by a shaped body, at least one via including an electrically conductive material, and at least one electrically conductive connection electrically conductively connected to the semiconductor chip and the via, wherein the via is laterally spaced apart from the semiconductor chip, the via includes a contact pin, the contact pin including an electrically conductive material, and the contact pin is laterally completely enclosed by the shaped body.

We also further provide an optoelectronic semiconductor component including an optoelectronic semiconductor chip having side areas covered by a shaped body, at least one plated-through hole including an electrically conductive material, and an electrically conductive connection electrically conductively connected to the semiconductor chip and the plated-through hole, wherein the plated-through hole is laterally spaced apart from the semiconductor chip, and the electrically conductive connection extends at a top side of the shaped body beneath an outer area of the shaped body.

We also further provide an optoelectronic semiconductor component including an optoelectronic semiconductor chip having side areas covered by a shaped body, at least one plated-through hole including an electrically conductive material, an electrically conductive connection electrically conductively connected to the semiconductor chip and the plated-through hole, and a phosphor layer containing or consisting of a phosphor that absorbs electromagnetic radiation generated by the semiconductor chip during operation and re-emits electromagnetic radiation in a different wavelength range from the optoelectronic semiconductor chip, wherein the plated-through hole is laterally spaced apart from the semiconductor chip, the plated-through hole completely penetrates through the shaped body, the plated-through hole extends from a top side of the shaped body to an underside of the shaped body, the electrically conductive connection extends at the top side of the shaped body, and the phosphor layer covers the optoelectronic semiconductor chip and the shaped body.

We also further provide an optoelectronic semiconductor component including an optoelectronic semiconductor chip having a top area at a top side, a bottom area at an underside and side areas connecting the top area and the bottom area, electrical contact locations at the top area or at the bottom area of the optoelectronic semiconductor chip, and an electrically insulating shaped body wherein the optoelectronic semiconductor chip is a flip-chip having the electrical contact locations only at one side, either the underside or the top side, the shaped body surrounds the optoelectronic semiconductor chip at its side areas, and the shaped body is free of a via that electrically connects the optoelectronic semiconductor chip.

We also further provide a method of producing an optoelectronic semiconductor component including providing a carrier, arranging at least one optoelectronic semiconductor chip at a top side of the carrier, applying a phosphor layer at the at least one semiconductor chip, forming a shaped body around the at least one optoelectronic semiconductor chip, wherein the shaped body surrounds all side areas of the at least one optoelectronic semiconductor chip, and removing the carrier, wherein the phosphor layer is applied before forming the shaped body.

We also further provide an optoelectronic semiconductor component including an optoelectronic semiconductor chip having a top area at a top side, a bottom area at an underside, side areas connecting the top and bottom areas, and epitaxially produced layers, electrical n- and A-side contacts at the bottom area of the optoelectronic semiconductor chip, and a shaped body which is electrically insulating, wherein the shaped body surrounds the optoelectronic semiconductor chip at its side areas, and the epitaxially produced layers are free from the shaped body.

We also further provide an optoelectronic semiconductor component including an optoelectronic semiconductor chip having a top area at a top side, a bottom area at an underside, side areas connecting the top area and the bottom area, and epitaxially produced layers, electrical n- and p-side contacts at the bottom area of the optoelectronic semiconductor chip, and an electrically insulating shaped body, wherein the shaped body surrounds the optoelectronic semiconductor chip at its side areas, and the epitaxially produced layers are free from the shaped body.

We also further provide a method of producing an optoelectronic semiconductor component including providing a carrier, arranging at least one optoelectronic semiconductor chip at a top side of the carrier, wherein the semiconductor chip includes semiconductor layers epitaxially deposited on a substrate, forming a shaped body around the at least one optoelectronic semiconductor chip, wherein the shaped body surrounds all side areas of the at least one optoelectronic semiconductor chip and the epitaxially produced layers are free of the shaped body, and removing the carrier.

We also further provide an optoelectronic semiconductor component including at least two optoelectronic semiconductor chips each having side areas, and an electrically insulating shaped body, wherein the shaped body surrounds all side areas of the at least two optoelectronic semiconductor chips, and the at least two optoelectronic semiconductor chips are connected to one another by the shaped body.

BRIEF DESCRIPTION OF THE DRAWINGS

FIG. 1 is a sectional schematic illustration of an exemplary optoelectronic semiconductor component during a step of an exemplary method of producing the same.

FIG. 2 is a sectional schematic illustration of the exemplary optoelectronic semiconductor component depicted in FIG. 1 during a further step of the exemplary method.

DETAILED DESCRIPTION

Figure 3:
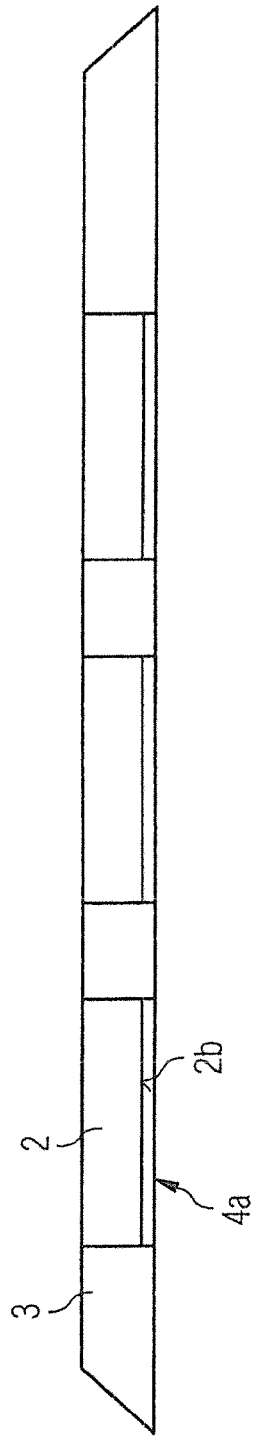
FIG. 3 is a sectional schematic illustration of the exemplary optoelectronic semiconductor component depicted in FIG. 2 during a further step of the exemplary method.

We provide a method of producing an optoelectronic semiconductor component. The optoelectronic semiconductor component is, for example, a light emitting diode that emits electromagnetic radiation. Alternatively, the optoelectronic semiconductor component can also be a photodiode provided for detecting electromagnetic radiation.

A carrier may first be provided. The carrier is a temporary carrier removed again in a final method step. The carrier can be, for example, a foil, a circuit board or generally a plate which is formed with a plastics material, a metal, a ceramic material or a semiconductor material.

At least one optoelectronic semiconductor chip may be arranged on the carrier at a top side of the carrier. The optoelectronic semiconductor chip is, for example, a light emitting diode chip or a photo diode chip. Furthermore, the optoelectronic semiconductor chip can be a laser diode chip. The at least one optoelectronic semiconductor chip is preferably fixed on the carrier to produce a mechanical connection between the optoelectronic semiconductor chip and the carrier, which later can be released nondestructively for the optoelectronic semiconductor chip. In other words, a sacrificial layer is arranged between the semiconductor chip and the carrier. The optoelectronic semiconductor chip can be fixed on the carrier by an adhesive, for example.

Preferably, a multiplicity of optoelectronic semiconductor chips are fixed on the carrier. The arrangement composed of the carrier and the multiplicity of optoelectronic semiconductor chips is then a so-called "artificial" wafer wherein a multiplicity of optoelectronic semiconductor chips preferably of the same type are arranged on a common carrier.

A shaped body may be shaped around the at least one optoelectronic semiconductor chip, preferably the multiplicity of optoelectronic semiconductor chips, wherein the shaped body covers all side areas of the at least one optoelectronic semiconductor chip. In other words, the at least one optoelectronic semiconductor chip is enveloped by the shaped body. The shaping-around or enveloping process can be effected, for example, by injection molding, casting, printing, lamination of a foil or the like. The shaped body is formed from a mechanically stabilizing material such as, for example, a plastic, a glass having a low melting point or a glass ceramic having a low melting point. The shaped body can, for example, contain epoxy resin, silicone, epoxy-silicon hybrid material, glass or glass ceramic or consist of one of these materials.

The shaped body is applied on the carrier such that it covers that surface of the carrier facing the at least one optoelectronic semiconductor chip, and is in direct contact with the surface. Furthermore, the shaped body is in direct contact at least in places with the side areas running, for example, transversely or perpendicularly with respect to the surface of the carrier. In this example, it is possible for all side areas of the at least one semiconductor chip to be completely covered by the shaped body. However, it is also possible for the semiconductor chips to be covered by the shaped body only up to a specific height at the side areas and for parts of the at least one semiconductor chip to project from the shaped body such that the side areas of the at least one optoelectronic semiconductor chip are free of the shaped body in places. Furthermore, it is also possible for the shaped body to completely cover the semiconductor chips at their exposed areas. That is to say, a surface of the at least one optoelectronic semiconductor chip facing away from the carrier can also be covered by the shaped body.

The carrier may be removed. That is to say, after the process of shaping around the at least one optoelectronic semiconductor chip, the carrier is removed from the composite assembly composed of shaped body and optoelectronic semiconductor chip. Removal can be effected, for example, by heating or thinning the carrier. Heating can be effected by a laser beam, for example. Thinning can be effected by grinding back the carrier, for example. Furthermore, it is possible for removal to be effected by chemical stripping or stripping the carrier or the adhesion layer present, if appropriate, on the carrier. After the carrier has been removed, the underside of the at least one optoelectronic semiconductor chip, the underside originally facing the carrier, is freely accessible. The underside can also be the emission side of the semiconductor chip through which radiation emerges from the semiconductor chip during the operation thereof. In other words, the semiconductor chip is then applied "face-down" onto the carrier. All side areas of the at least one optoelectronic semiconductor chip are covered by the shaped body at least in places. That is to say, after the removal of the carrier, the shaped body constitutes a mechanically stabilizing body surrounding the at least one optoelectronic semiconductor chip at its side areas and connects, if present, a multiplicity of optoelectronic semiconductor chips to one another.

The method of producing an optoelectronic semiconductor component comprises:

providing a carrier;

arranging at least one optoelectronic semiconductor chip at a top side of the carrier;

shaping a shaped body around the at least one optoelectronic semiconductor chip wherein the shaped body covers all side areas of the at least one optoelectronic semiconductor chip; and removing the carrier.

In this example, the method steps described are preferably carried out in the order specified.

A multiplicity of optoelectronic semiconductor chips may be arranged at the top side of the carrier, wherein each of the semiconductor chips is provided during operation to generate electromagnetic radiation in a wavelength range having a peak wavelength assigned to the semiconductor chip. That is to say, each of the semiconductor chips is suitable for generating electromagnetic radiation. In this example, the semiconductor chip generates electromagnetic radiation in a specific wavelength range during operation. The electromagnetic radiation generated has a maximum in the wavelength range at a specific wavelength, the peak wavelength. In other words, the peak wavelength is the dominant wavelength of the electromagnetic radiation generated by the semiconductor chip during operation.

In this example, the peak wavelength of each of the semiconductor chips deviates from an average value of the peak wavelengths of all the optoelectronic semiconductor chip by at most +/−2%. That is to say, the optoelectronic semiconductor chips are optoelectronic semiconductor chips that emit electromagnetic radiation at the same or similar wavelengths. Preferably, the peak wavelength of each of the semiconductor chips deviates from an average value of the peak wavelengths of all the optoelectronic semiconductor chips at most by +/−1%, particularly preferably by at most +/−0.5%.

In other words, the optoelectronic semiconductor chips arranged on the carrier are presorted with regard to their emission wavelength. Those optoelectronic semiconductor chips scarcely differing from one another or not differing from one another at all in terms of their peak wavelength are arranged jointly on the carrier.

By way of example, the optoelectronic semiconductor chips are sorted with regard to their peak wavelength after their production (so-called "binning"). Those optoelectronic semiconductor chips classified into a common group during this sorting are arranged on the carrier.

A common phosphor layer may be disposed downstream of the optoelectronic semiconductor chips at their top side or their underside before or after the shaping-around process. In this example, "common phosphor layer" means that a phosphor layer having the same or similar properties is disposed downstream of all the optoelectronic semiconductor chips. That is to say, the phosphor layer of all the optoelectronic semiconductor chips consists, for example, of the same material and has the same thickness.

The phosphor layer contains or consists of a phosphor provided absorb the electromagnetic radiation generated by the semiconductor chips during operation and re-emits electromagnetic radiation in a different wavelength range than the optoelectronic semiconductor chips. By way of example, the optoelectronic semiconductor chips generate blue light during operation and yellow light is re-emitted by the phosphor of the phosphor layer, the yellow light mixing with the blue light to form white light. The phosphor layer can be applied, for example, in the form of phosphor particles introduced in a matrix material such as, for example, silicone or ceramic. Furthermore, the phosphor layer can be applied as a ceramic lamina containing the phosphor or consists of a ceramic phosphor to that surface of the semiconductor chips facing away from the carrier. In this example, it is possible for the phosphor layer to be applied directly to that surface of the optoelectronic semiconductor chips facing away from the carrier.

Particularly preferably, the optoelectronic semiconductor chips, as just described, are similar optoelectronic semiconductor chips scarcely differing or not differing from one another at all with regard to their peak wavelength. Advantageously, a common phosphor layer can be disposed downstream of these similar optoelectronic semiconductor chips. On account of the similarity of the optoelectronic semiconductor chips and the common phosphor layer, the optoelectronic semiconductor chips emit during operation mixed light having similar or identical properties. Unlike otherwise customary production of optoelectronic semiconductor components, therefore, it is not necessary for an appropriate phosphor layer to be disposed downstream of each optoelectronic semiconductor chip such that a desired mixed radiation composed of the electromagnetic radiation emitted directly by the optoelectronic semiconductor chip and the electromagnetic radiation re-emitted by the phosphor layer is established.

The top side, facing away from the carrier, of the at least one semiconductor chip may be freed of the shaped body or it remains free of the shaped body. That is to say, the shaped body is either applied such that that the surface of the at least one semiconductor chip facing away from the carrier is not covered with the material of the shaped body. Alternatively, the shaped body can be removed again from the top side of the semiconductor chips after the shaped body has been applied. By way of example, the phosphor layer can then be applied to the surface free of the shaped body.

However, it is also possible for the semiconductor chips to be fixed onto the carrier by their emission side. Upon removal of the carrier, the surface facing the carrier, that is to say, the underside is exposed. In this variant of the method, at least one connection contact can be situated on the emission side of each of the semiconductor chips.

At least one plated-through hole with an electrically conductive material may be produced before or after the shaping-around process for each semiconductor chip. The plated-through hole is laterally spaced apart from the assigned semiconductor chip. That is to say, in a direction running, for example, parallel to the surface of the carrier assigned to the semiconductor chips, a plated-through hole is produced at a distance from the semiconductor chip. In this example, the plated-through hole completely penetrates through the shaped body and extends from a top side of the shaped body to an underside of the shaped body. After conclusion of the method, that is to say, after removal of the carrier, the plated-through hole is freely accessible at least at the underside of the shaped body. At the top side of the shaped body, the plated-through hole can be covered by the phosphor layer.

Before the shaped body is shaped around, the plated-through hole can be produced by contact pins, for example, arranged at the top side of the carrier between the semiconductor chips before the shaping-around process. In this example, the contact pins are formed from an electrically conductive material such as copper, for example. In this example, the contact pins can also be formed integrally with the carrier. That is to say, a substrate with plated-through holes present is used as the carrier. Furthermore, the carrier can also be a leadframe.

Alternatively, it is possible for the plated-through holes to be produced by the production of cutouts in the shaped body after the process of shaping around the semiconductor chip. By way of example, by laser drilling or other types of material removal, it is possible to produce holes in the shaped body that completely penetrate through the shaped body and extend from the top side thereof to the underside thereof. These holes are then filled with a conductive material. The conductive material can be, for example, a plating, a solder material or a conductive adhesive.

An electrically conductive connection may be produced between the plated-through hole and the assigned semiconductor chip. In this example, the electrically conductive connection electrically conductively connects to the surface facing away from the carrier at the top side of the semiconductor chip and extends along the top side of the shaped body. The electrically conductive connection electrically conductively contacts, for example, a bonding pad at the top side of the assigned semiconductor chip and extends as far as the plated-through hole. In this example, the connection extends at the top side of the shaped body either on the outer area of the shaped body or closely beneath the outer area of the shaped body. The electrically conductive connection can be produced by sputtering, photolithography, plating and/or etching-back. Furthermore, it is possible, for the purpose of producing the electrically conductive connection, for insulation material and metal to be applied by printing, to be applied as a metal paste by a sintering method (particularly if the shaped body is formed from a ceramic material), to be applied as conductive adhesive or the like. Thus, it is also possible, for example, for the electrically conductive connections to be applied by an injection-molding method. That is to say, the electrically conductive connections are then applied in the manner of a "molded interconnected device" (MID).

Production of plated-through holes and assigned electrically conductive connections is advantageous if the optoelectronic semiconductor chips have electrically conductive contact locations at their top side and underside facing away from the top side. Alternatively, the use of flip-chip semiconductor chips is possible, having electrical contact locations only at one side, either the underside or the top side. The through-plating through the shaped body can be obviated in this example.

We also provided an optoelectronic semiconductor component. The optoelectronic semiconductor component can preferably be produced by one of the methods described here. That is to say, all the features disclosed for the method are also disclosed for the optoelectronic semiconductor component, and vice versa.

The optoelectronic semiconductor component may comprise an optoelectronic semiconductor chip, the side areas of which are covered by a shaped body. In this example, the side areas are those areas running transversely with respect to the outer area of the optoelectronic semiconductor chip at its top side and its underside and connect the outer areas to one another. In this example, the side areas can be completely covered by the shaped body. Furthermore, it is also possible for the side areas to be covered by the shaped body only up to a specific height as shown, for example, in FIG. 11 that shows that the epitaxially produced layers 21 are free from the shaped body 3 since the epitaxially produced layers 21 protrude from the shaped body 3. By way of example, the optoelectronic semiconductor chip can be a semiconductor chip in which semiconductor layers are deposited epitaxially onto a substrate. It is then possible for the side areas of the semiconductor chip to be covered such that the epitaxially produced layers are free of the shaped body. The epitaxially produced layers can then be covered by a further material, for example, by a printing process, or remain free.

The optoelectronic semiconductor component may comprise at least one plated-through hole comprising an electrically conductive material. The electrically conductive material is, for example, a metal or an electrically conductive adhesive.

The component may comprise an electrically conductive connection electrically conductively connected to the semiconductor chip and the plated-through hole. The electrically conductive connection is formed, for example, with a metal or an electrically conductive adhesive.

The plated-through hole may be laterally spaced apart from the semiconductor chip. In this example, the lateral direction is that direction running transversely or perpendicularly with respect to the side areas of the optoelectronic semiconductor chip. That is to say, the plated-through hole is arranged laterally with respect to the semiconductor chip and runs, for example, parallel or substantially parallel to a side area of the optoelectronic semiconductor chip. In this example, the plated-through hole preferably completely penetrates through the shaped body and extends from a top side of the shaped body to an underside of the shaped body. In this example, it is possible for the plated-through hole to be freely accessible at the top side and the underside of the shaped body.

The electrically conductive connection may extend at the top side of the shaped body. That is to say, the electrically conductive connection connects the semiconductor chip to the plated-through hole and, in this example, runs between semiconductor body and plated-through hole at the top side of the shaped body. In this example, the electrically conductive connection can be arranged on an outer area of the shaped body.

The optoelectronic semiconductor component may comprise an optoelectronic semiconductor chip, the side areas of which are covered by a shaped body. Furthermore, the optoelectronic semiconductor component comprises at least one plated-through hole comprising an electrically conductive material and an electrically conductive connection electrically conductively connected to the semiconductor chip and the plated-through hole. In this example, the plated-through hole is laterally spaced apart from the semiconductor chip and penetrates through the shaped body completely. The plated-through hole extends from a top side of the shaped body to an underside of the shaped body and the electrically conductive connection extends at the top side of the shaped body from the semiconductor chip to the plated-through hole.

The shaped body may be optically reflective. This can be achieved, for example, by introducing particles that reflect electromagnetic radiation, in particular light, into a matrix material of the shaped body. Electromagnetic radiation that emerges at the side areas of the optoelectronic semiconductor chip can then be reflected by the shaped body. In this example, the shaped body does not cover the optoelectronic semiconductor chip at the top side thereof at least in places. The particles are formed, for example, with at least one material or contain at least one material selected from the group consisting of $TiO_2$, $BaSO_4$, ZnO and $Al_xO_y$. It is particularly advantageous if the shaped body contains silicone or consists of silicone and the particles consist of titanium oxide.

Preferably, the particles are introduced into the shaped body in a concentration such that the latter appears white.

Furthermore, it is possible for the shaped body to be radiation-transmissive. This is particularly advantageous for optoelectronic semiconductor chips which emit a large proportion of their electromagnetic radiation through the side areas.

The semiconductor component may comprise a multiplicity of semiconductor chips electrically conductively connected to one another by electrically conductive connections extending at the top side of the shaped body. By way of example, the semiconductor chips can connect in series or in parallel by the electrically conductive connections. The semiconductor chips are in each example covered by the shaped body at their side areas. The shaped body constitutes a connection material to which the electrically conductive semiconductor chips connect to form the optoelectronic semiconductor component.

The method described here and also the optoelectronic semiconductor component described here are explained in greater detail below on the basis of examples and the associated figures.

Elements that are identical, of identical type or act identically are provided with the same reference symbols in the figures. The figures and the size relationships of the elements illustrated in the figures among one another should not be regarded as to scale, but rather, individual elements may be illustrated with an exaggerated size to enable better illustration and/or to afford a better understanding.

A first method step of producing an optoelectronic semiconductor component is explained in greater detail on the basis of the schematic sectional illustration in FIG. 1. In the method, a carrier 1 is first provided. The carrier 1 is, for example, a carrier formed with a metal such as copper or aluminum, with a ceramic, with a semiconductor material or with a plastic. A multiplicity of optoelectronic semiconductor chips 2 are arranged at the top side 1a of the carrier 1, the chips being light emitting diode chips. The semiconductor chips 2 are fixed to the carrier 1 by a connection means 5. The connection means 5 is an adhesive, for example. In this example, the underside 2b of the semiconductor chips 2 faces the top side 1a of the carrier 1. A contact location 4a provided for making electrical contact with the semiconductor chip 2 is situated at the underside 2b of the semiconductor chips 2. By way of example, the contact location 4a is a metalization at the underside 2b of the semiconductor chip 2. A radiation exit area of the semiconductor chip 2 can comprise the side areas 2c and the outer area at the top side 2a.

In this example, it is possible for a contact location 4a to be situated at the top side 2a and a contact location 4b to be situated at the underside 2b. Furthermore, both contact locations 4a, 4b can be situated at the same side. Furthermore, it is possible for the underside 2b or the top side 2a to be the emission side of the semiconductor chip 2. That is to say, the radiation exit area of the semiconductor chip 2 can comprise the side areas 2c and the outer area at the top side 2a and/or the underside 2b.

A further method step is explained in conjunction with FIG. 2. In this method step, a shaped body 3 is applied, for example, by injection molding a molding compound such that the side areas 2c of the semiconductor chips 2 are covered by the shaped body and the shaped body connects the semiconductor chips 2 to one another. In this example, the underside 3b of the shaped body is in direct contact with the carrier 1 or the connection means 5 at the top side 1a of the carrier 1. The shaped body 3 can, at its top side 3a, terminate flush with the surface at the top side 2a of the semiconductor chip 2. Furthermore, it is possible for the shaped body 3, in contrast to the illustration in FIG. 2, to cover the side areas 2c of the semiconductor chips 2 only up to a specific height and for the semiconductor chips 2 to project beyond the shaped body 3 at the top side 3a thereof.

The shaped body 3 can be radiation-transmissive, for example, transparent, radiation-absorbent or reflective.

In the method step explained in conjunction with FIG. 3, the carrier 1 together with the connection means layer 5 optionally present is detached from the shaped body and the semiconductor chips 2. There remains a composite assembly composed of semiconductor chips 2 connected to one another by the shaped body 3. At the underside 2b of the semiconductor chips 2, the contact location 4a and also the radiation passage area, in an example of a "face-down" arrangement, is exposed.

Figure 4:
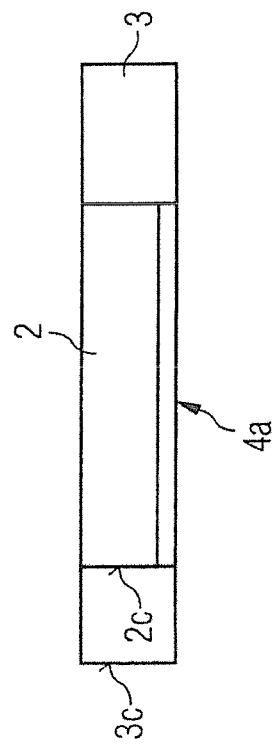
FIG. 4 is a sectional schematic illustration of an exemplary optoelectronic semiconductor component.
Figure 5:
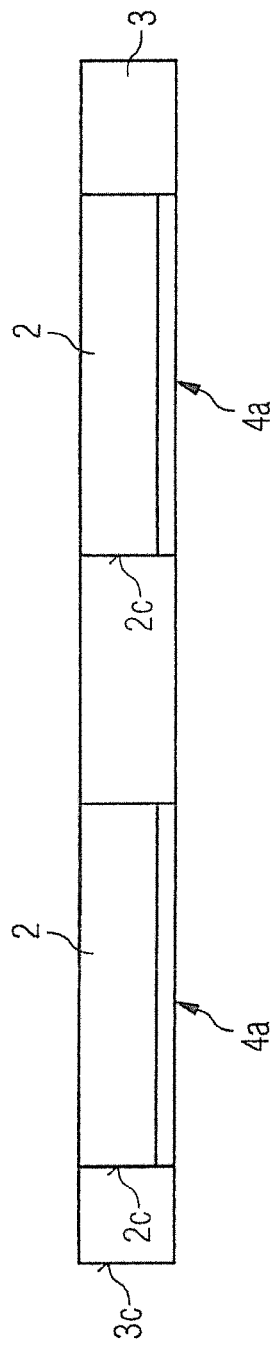
FIG. 5 is a sectional schematic illustration of a further exemplary optoelectronic semiconductor component.
Figure 11:
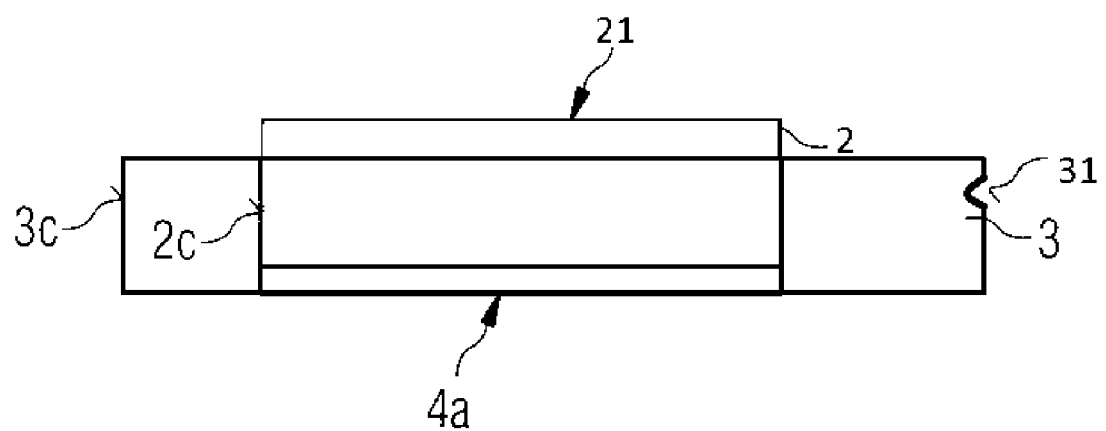
FIG. 11 is a sectional illustration of another exemplary optoelectronic semiconductor component.

In a further method step, illustrated schematically in FIGS. 4 and 5, the composite assembly of the semiconductor chips 2 can be singulated to form individual optoelectronic semiconductor components comprising one or more semiconductor chips 2. The singulation produces side areas 3c of the shaped body which have traces of material removal. By way of example, the side areas 3c can have sawing grooves 31 as shown in FIG. 11, for example, or grinding tracks which originate from the singulation of the shaped body 3. Each of the semiconductor chips 2 is covered by the shaped body 3 at least in places at its side areas 2c.

Figure 6:
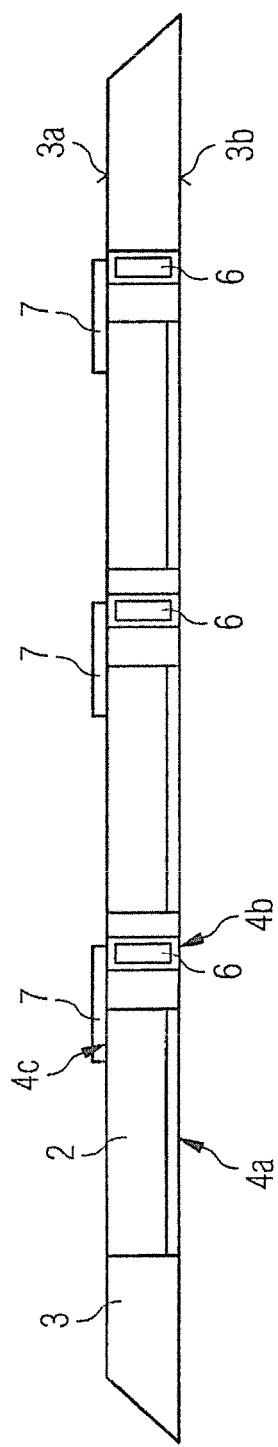
FIG. 6 is a sectional schematic illustration of an exemplary optoelectronic semiconductor component during a further step of an exemplary method of producing the same.

A further method step is explained with reference to the schematic sectional illustration in FIG. 6, which step can be carried out before or after the molding compound is shaped around the semiconductor chips 2 and before or after the carrier is removed. This method step involves producing plated-through holes 6 made from an electrically conductive material which penetrate through the shaped body 3 from the top side 3a thereof to the underside 3b thereof. The plated-through holes 6 are laterally spaced apart from the semiconductor bodies 2. Each semiconductor body 2 is preferably assigned a plated-through hole. In this example, the assignment can also be one-to-one. Furthermore, it is possible for one plated-through hole 6 to be present for a plurality of semiconductor chips 2. After the plated-through hole 6 has been produced an electrically conductive connection 7 is formed at the top side 3a on the surface of the shaped body 3, which electrically conductive connects a contact location 4c of the semiconductor chip 2 to the plated-through hole 6. At the underside of the shaped body 3, the plated-through holes 6 are freely accessible and form there a contact location 4b for the semiconductor component.

Figure 7:
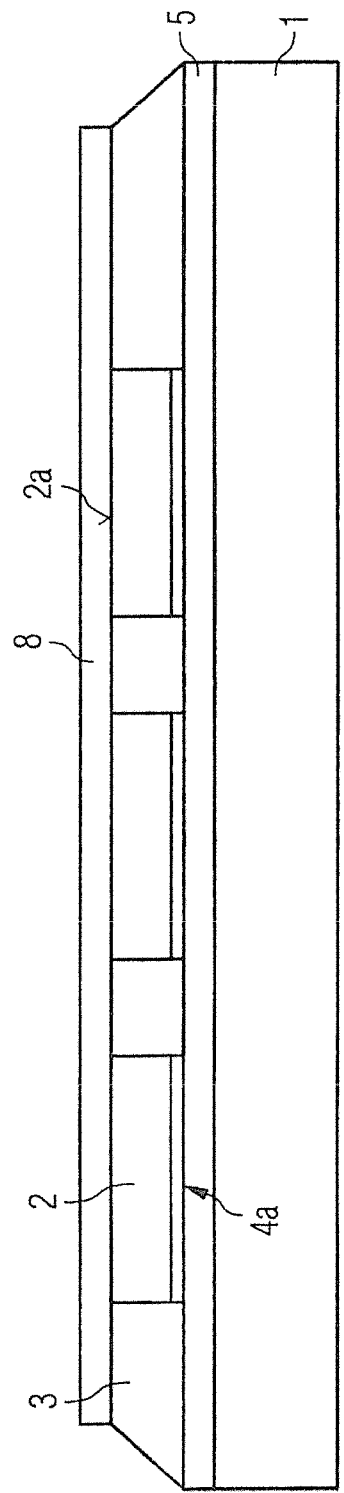
FIG. 7 is a sectional schematic illustration of an exemplary optoelectronic semiconductor component during another step of an exemplary method of producing the same.

A further method step is explained with reference to FIG. 7 in a schematic sectional illustration, which step can take place after the shaped body has been applied. In this method step, a phosphor layer 8 at the top side of the shaped body 3 is applied to the semiconductor chips 2 at their top side 2a. In this example, the phosphor layer 8 can be embodied continuously over all the semiconductor chips 2, as illustrated in FIG. 7. Furthermore, it is possible that a dedicated phosphor layer can be applied on each semiconductor chip 2. This can then also be effected before the molding compound is applied. The optoelectronic semiconductor chips in the example of FIG. 7 are preferably light emitting diode chips having a similar or identical emission characteristic, that is to say having a similar or identical peak wavelength as described further above. A uniform phosphor layer 8 is applied to the semiconductor chips 2. This results in optoelectronic semiconductor components having similar or identical emission characteristics. By way of example, the semiconductor components generate white light having a similar or identical color locus and/or having a similar or identical color temperature during operation.

Figure 8:
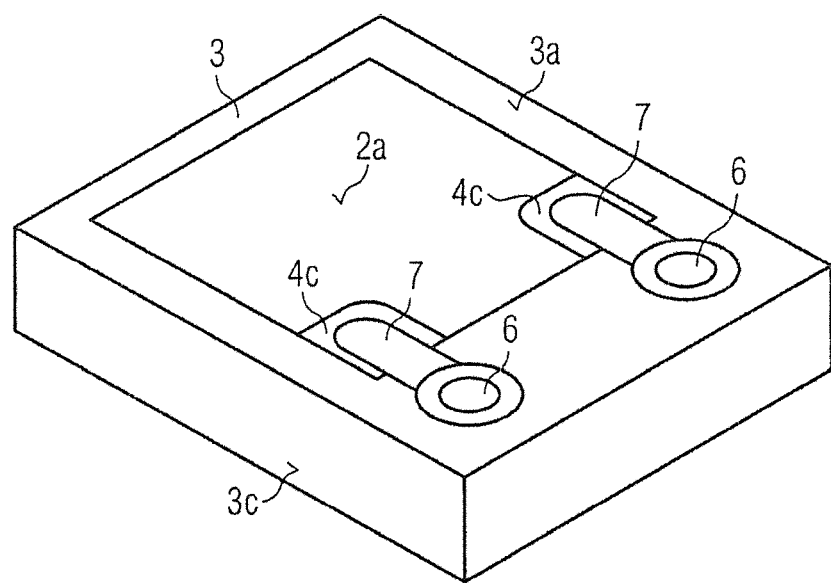
FIG. 8 is a schematic top perspective view of an exemplary optoelectronic semiconductor component.
Figure 9:
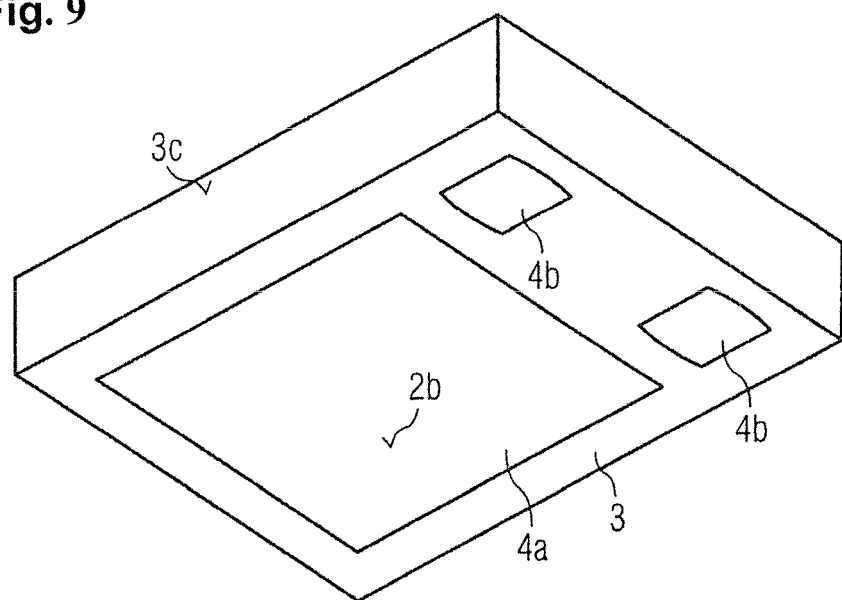
FIG. 9 is a schematic bottom perspective view of the exemplary optoelectronic semiconductor component depicted in FIG. 8.

FIGS. 8 and 9 show views of an optoelectronic semiconductor component described here in a schematic perspective illustration. FIG. 8 shows the semiconductor component from the top side 2a of the semiconductor chip 2. The semiconductor component comprises precisely one semiconductor chip 2 completely surrounded by the molding compound 3 at its side areas 2c. Plated-through holes 6 are led through the molding compound 3 and connected by electrically conductive connections 7 to contact locations 4c at the top side 2a of the semiconductor chip 2. At the underside of the semiconductor component, see FIG. 9, a contact location 4a is formed so that the semiconductor chip 2 is contact-connected on the p-side, for example. The n-side contact-connection is then effected by the contact locations 4b formed by the plated-through holes 6. The shaped body 3 is likewise arranged between the plated-through holes 6 and the semiconductor chip 2, the shaped body electrically insulating the plated-through holes 6 from the semiconductor chip 2.

As an alternative to the example shown, the semiconductor chip 2 can also be a semiconductor chip in which, for example, n- and p-side contacts are arranged jointly at the underside 2b of the semiconductor chip. The plated-through holes 6 can be dispensed with in this example.

Figure 10:
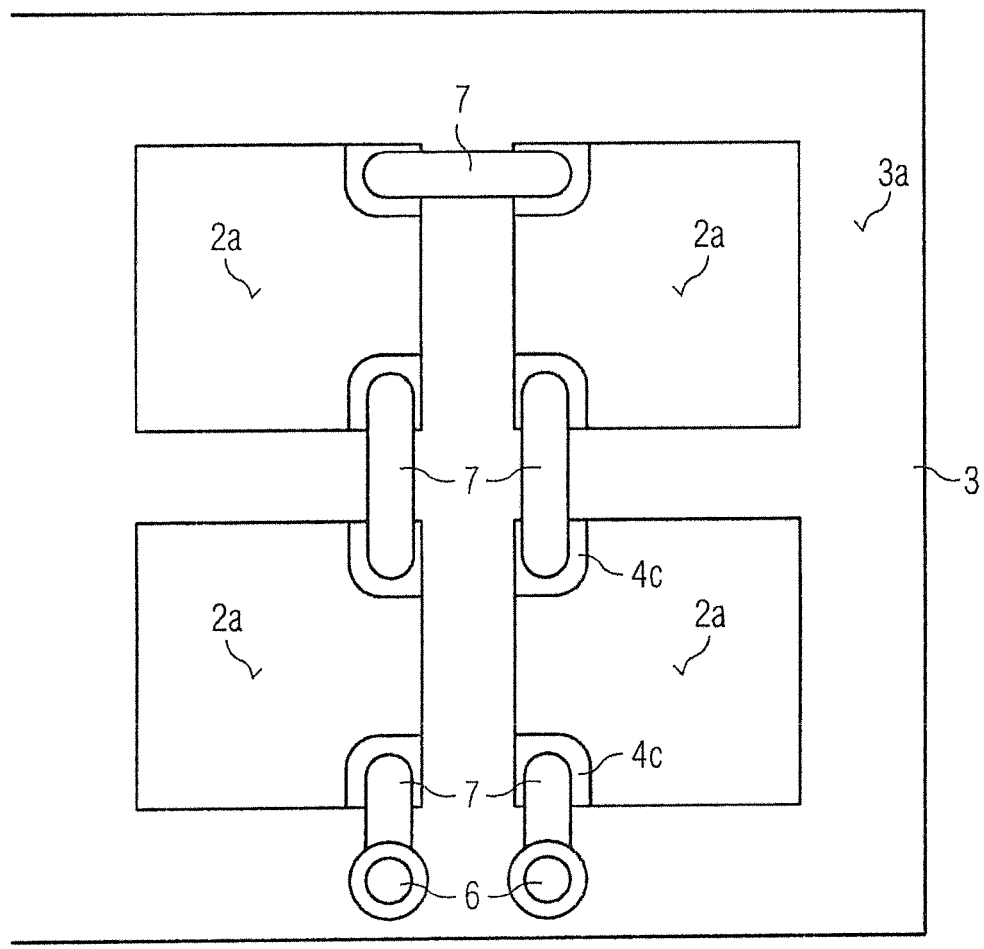
FIG. 10 is a schematic plan view of another exemplary optoelectronic semiconductor component.

FIG. 10 shows, on the basis of a schematic plan view, a further example of a semiconductor component described here. In this example, the semiconductor component comprises four semiconductor chips 2 connected to one another by the shaped body 3. The semiconductor chips 2 electrically conductively connect to one another by electrically conductive connections 7 arranged at the top side 3a of the shaped body 3 and run, for example, on the outer area of the shaped body. The semiconductor chips connect in series by the electrically conductive connections 7 and electrically contact-connected by contact locations 4b formed by the plated-through holes 6 and also contact locations 4a.

The method and semiconductor components described here are distinguished, inter alia, by the following advantages: heat can be dissipated from the semiconductor components over the whole area via the entire underside 2 of the semiconductor chips 2.

Flip-chip contact-connection of the semiconductor component is possible via the plated-through holes 6. That is to say, a bonding wire, which is mechanically susceptible, can be obviated. On account of the fact that a multiplicity of semiconductor chips 2 can be surrounded with the shaped body 3 simultaneously, a particularly cost-saving method is involved.

Presorting the optoelectronic semiconductor chips, for example, with regard to their peak wavelength enables a common phosphor layer 8 to be applied simultaneously to all the semiconductor chips, which are then distinguished by similar or identical emission characteristics.

Furthermore, a semiconductor component having an almost arbitrary number of semiconductor chips 2 can be produced in a flexible manner by the method. The area utilization of the semiconductor component is optimal.

Our methods and components are not restricted to the examples by the description on the basis of those examples. Rather, the disclosure encompasses any novel feature and also any combination of features, which, in particular, includes any combination of features in the appended claims, even if the feature or combination itself is not explicitly specified in the claims or examples.

The invention claimed is:

1. An optoelectronic semiconductor component comprising:
   an optoelectronic semiconductor chip having a top area at a top side, a bottom area at an underside, at least one side area connecting said top area and said bottom area;
   electrical contact locations at the top area or at the bottom area of the optoelectronic semiconductor chip; and
   a molded body, wherein
   the molded body surrounds the optoelectronic semiconductor chip at all side areas at least in places,
   the molded body is electrically insulating, and
   the molded body is free of any conductive element that completely penetrates the molded body.

2. The optoelectronic semiconductor component according to claim 1, wherein the optoelectronic semiconductor chip comprises said electrical contract locations only at one side, either the underside or the top side.

3. The optoelectronic semiconductor component according to claim 1, wherein n- and p-side contacts of the optoelectronic semiconductor chip are freely accessible and the optoelectronic semiconductor component is electrically contactable via the n- and p-side contacts of the optoelectronic semiconductor chip.

4. The optoelectronic semiconductor component according to claim 1, wherein the molded body is reflective for electromagnetic radiation produced during operation of the optoelectronic semiconductor chip.

5. The optoelectronic semiconductor component according to claim 1, wherein the molded body comprises side surfaces facing away from side areas of the optoelectronic semiconductor chip, and the side surfaces comprise grooves.

6. The optoelectronic semiconductor component according to claim 1, further comprising a phosphor layer comprising phosphor particles, wherein the phosphor layer contacts the molded body and the optoelectronic semiconductor chip and the phosphor particles absorb electromagnetic radiation generated by the semiconductor chip during operation and re-emit electromagnetic radiation in a different wavelength range than the optoelectronic semiconductor chip.

7. The optoelectronic semiconductor component according to claim 6, wherein the phosphor layer is in direct contact with the optoelectronic semiconductor chip and the molded body.

8. The optoelectronic semiconductor component according to claim 7, wherein the phosphor layer comprises a matrix material into which phosphor particles are introduced.

9. The optoelectronic semiconductor component according to claim 7, wherein the molded body comprises a first matrix material into which particles that reflect electromagnetic radiation are introduced, the phosphor layer comprises a second matrix material into which phosphor particles are introduced, and the first and the second matrix material comprise a silicone.

10. A method of producing an optoelectronic semiconductor component comprising:
    providing a carrier;
    arranging at least one optoelectronic semiconductor chip at a top side of the carrier, wherein the semiconductor chip comprises semiconductor layers deposited on a substrate; and
    forming a molded body around the at least one optoelectronic semiconductor chip, wherein the molded body surrounds all side areas of the at least one optoelectronic semiconductor chip at least in places such that at least some of the layers deposited on the substrate are free of the molded body such that these layers are not covered or completely exposed, removing the carrier.

11. The method according to claim 10, wherein the layers deposited on the substrate are covered with a further material.

12. The method according to claim 10, wherein the layers deposited on the substrate remain free of the molded body and a further material.

13. The method according to claim 10, wherein the molded body comprises a matrix material and particles are introduced into the matrix material.

14. The method according to claim 13, wherein the matrix material contains silicone or consists of silicone.

15. The method according to claim 10, wherein the at least one optoelectronic semiconductor chip is covered by the molded body only up to a specific height at its side areas, and parts of the at least one semiconductor chip protrude from the molded body.

16. The method according to claim 15, wherein the side areas remain free from the molded body.

* * * * *